(12) United States Patent
Huang et al.

(10) Patent No.: US 10,147,858 B1
(45) Date of Patent: Dec. 4, 2018

(54) FLEXIBLE LED DEVICE AND FLEXIBLE LED PANEL

(71) Applicant: FLEX TEK CO., LTD., Taoyuan (TW)

(72) Inventors: Yao-Hsien Huang, Taoyuan (TW); Sheng-Hui Chen, Hsinchu (TW)

(73) Assignee: FLEX TEK CO., LTD. (TW)

( * ) Notice: Subject to any disclaimer, the term of this patent is extended or adjusted under 35 U.S.C. 154(b) by 0 days.

(21) Appl. No.: 15/798,536

(22) Filed: Oct. 31, 2017

(30) Foreign Application Priority Data

Aug. 4, 2017 (TW) .............................. 106126344 A (51) Int. Cl.
| | |
|---|---|
| *H01L 33/06* | (2010.01) |
| *H01L 33/12* | (2010.01) |
| *H01L 33/32* | (2010.01) |
| *H01L 33/40* | (2010.01) |
| *H01L 33/42* | (2010.01) |
| *H01L 33/48* | (2010.01) |
| *H01L 33/50* | (2010.01) |
| *H01L 33/58* | (2010.01) |
| *H01L 33/62* | (2010.01) |
| *H01L 25/075* | (2006.01) |
| *H01L 33/64* | (2010.01) |

(52) U.S. Cl.
CPC .......... *H01L 33/62* (2013.01); *H01L 25/0753* (2013.01); *H01L 33/06* (2013.01); *H01L 33/12* (2013.01); *H01L 33/32* (2013.01); *H01L 33/40* (2013.01); *H01L 33/42* (2013.01); *H01L 33/486* (2013.01); *H01L 33/502* (2013.01); *H01L 33/507* (2013.01); *H01L 33/58* (2013.01); *H01L 33/641* (2013.01)

(58) Field of Classification Search
CPC ... H01L 25/0753; H01L 33/12; H01L 33/486; H01L 33/62; H01L 33/641
See application file for complete search history.

(56) References Cited

U.S. PATENT DOCUMENTS

2016/0233383 A1* 8/2016 Matias .................... H01L 33/02

* cited by examiner

*Primary Examiner* — Daniel P Shook (57) ABSTRACT

The present invention discloses a flexible LED device and a flexible LED panel. Differing an approach for substrate lift-off and bonding is conventionally adopted to exchange a sapphire substrate of an LED die for a copper substrate having excellent thermal conductivity, this novel flexible LED device is constituted by a thin-metal-made substrate, a substrate protection layer, a lattice matching layer, a light-emitting structure, a first electrode, and a second electrode. It is worth explaining that, thanks to that the thin-metal-made substrate with a thickness in a range from 25 μm to 150 μm exhibits outstanding mechanical characteristics including flexibility, thermal conductivity and thermal resistance, engineers can adopt thin film deposition technologies such as PECVD and MOCVD as well as utilize roll-to-roll manufacturing systems to mass produce this flexible LED device. Besides, heat produced during the illumination of the flexible LED device can be effectively dissipated by the thin-metal-made substrate.

20 Claims, 8 Drawing Sheets

FLEXIBLE LED DEVICE AND FLEXIBLE LED PANEL

BACKGROUND OF THE INVENTION

1. Field of the Invention

The present invention relates to the technology field of lighting devices, and more particularly to a flexible LED device and a flexible LED panel.

2. Description of the Prior Art

Light-emitting diode, having advantages of small size and long service life, has become one kind of popular lighting element nowadays and been widely applied in human life.

Figure 1:
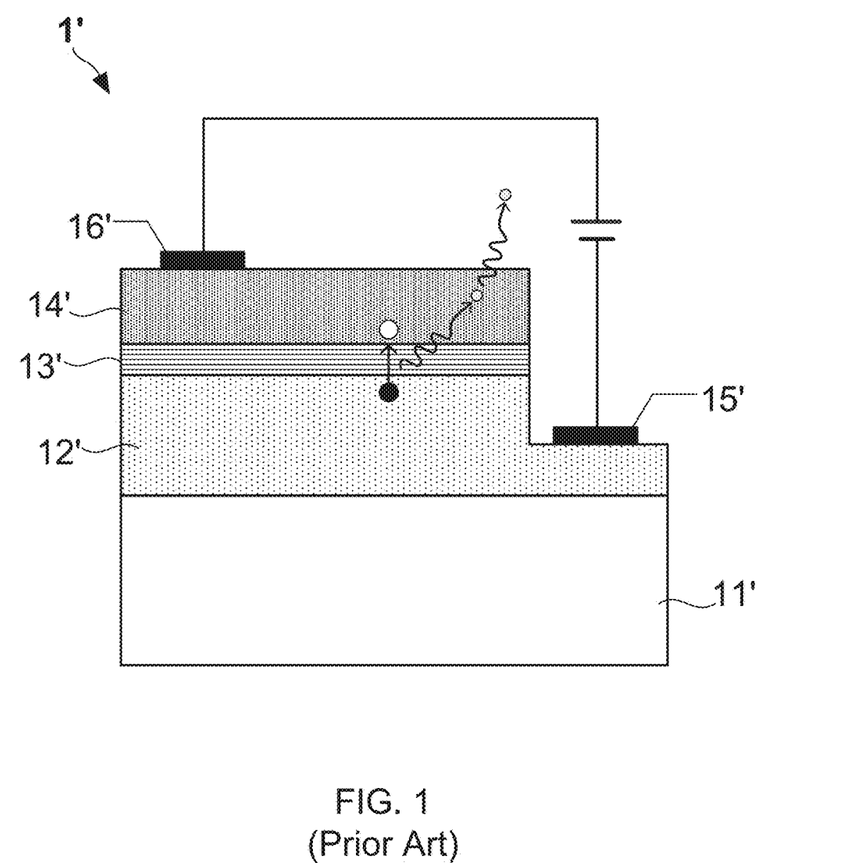
FIG. 1 shows a cross-sectional side view of a traditional LED element.

FIG. 1 shows a cross-sectional side view of a traditional LED element. The traditional LED element 1' comprises: a sapphire substrate 11', a n-type semiconductor layer 12', a multiple quantum well (MQW) layer 13', a p-type semiconductor layer 14', a first electrode 15, and a second electrode 16'. Two common manufacturing materials for the n-type semiconductor layer 12' and the p-type semiconductor layer 14' are n-type gallium nitride (n-GaN) and p-type gallium nitride (p-GaN), respectively. Moreover, the MQW layer 13' is a multiple stacked structure of InGaN and GaN.

Electronic device engineers skilled in development and manufacture of LED elements should know that, the traditional LED element 1' displayed by FIG. 1 is a GaN-based blue LED device, which possesses following practical-application shortcomings:

(1) Owing to there has a big lattice mismatch between the sapphire substrate 11' and the n-type semiconductor layer 12', a lot of misfit dislocations leading to large reduction of electron-hole recombination rate are formed at the interface of the sapphire substrate 11' and the n-type semiconductor layer 12'.
(2) The sapphire substrate 11' cannot effectively dissipate the heat produced under the operation of the LED element 1' due to its poor thermal conductivity.

Figure 2A:
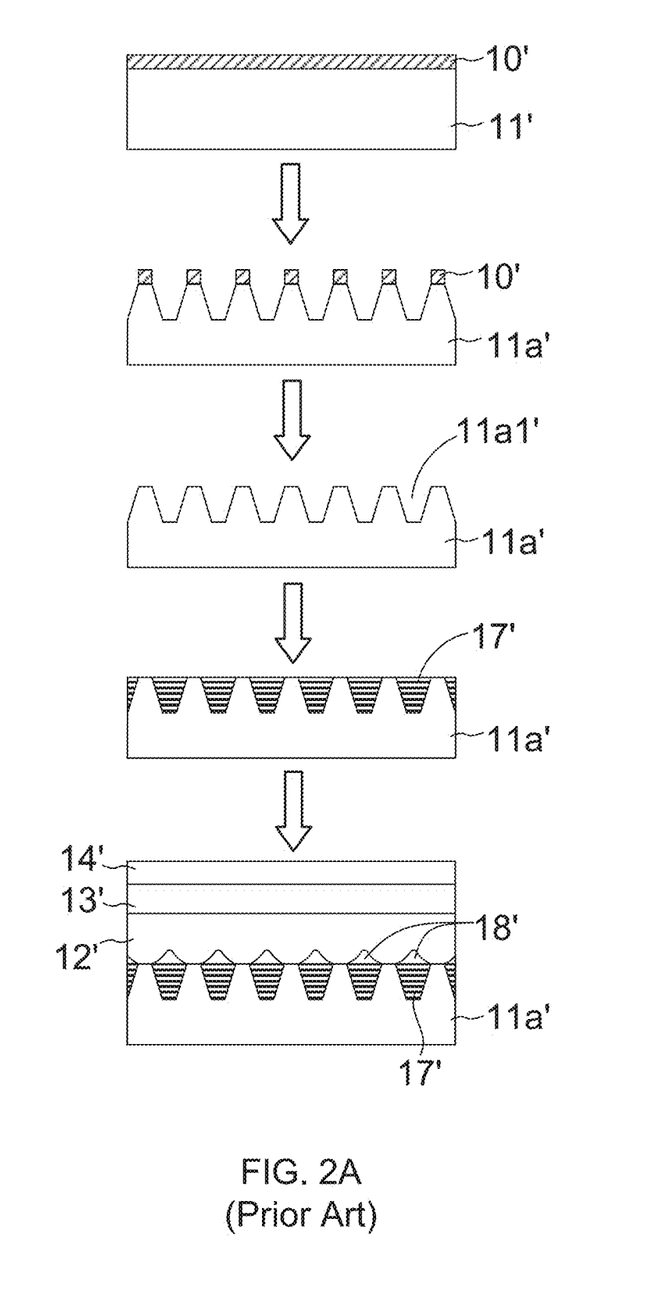
FIG. 2A and FIG. 2B show a manufacturing process flow diagram of a method for lift-off of light-emitting diode substrate.
Figure 2B:
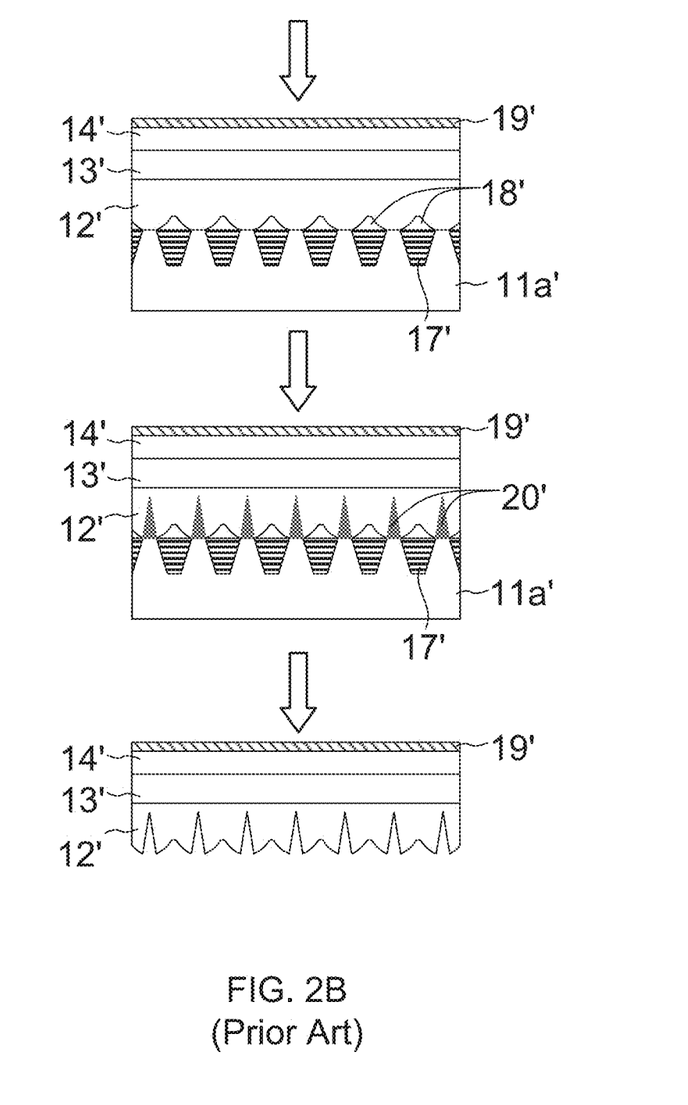

For overcoming the practical-application shortcomings of the traditional LED element 1', U.S. Pat. No. 8,507,357 particularly discloses a method for lift-off of light-emitting diode substrate. FIG. 2A and FIG. 2B show a manufacturing process flow diagram of the method for lift-off of light-emitting diode substrate. First of all, the lift-off method is to form a transition layer 10' on the sapphire substrate 11', so as to process the sapphire substrate 11' to a patterned sapphire substrate (PSS) 11a' under the protection of the transition layer 10'.

Subsequently, a block layer 17' is deposited onto the patterned sapphire substrate 11a', wherein the block layer 17' also full fills a plurality grooves of the patterned sapphire substrate 11a'. After that, the n-type semiconductor layer 12', the multiple quantum well (MQW) layer 13', and the p-type semiconductor layer 14' are sequentially formed on the block layer 17' and the patterned sapphire substrate 11a'. It is worth noting that, there are a plurality of first voids 18' existing between the n-type semiconductor layer 12' and the patterned sapphire substrate 11a'. Continuously, after a specific substrate layer 19' is connected to the p-type semiconductor layer 14', wet etching technology is adopted for making a plurality of second voids 20' in the n-type semiconductor layer 12' via those first voids 18', so as to lift off the patterned sapphire substrate 11a' from the n-type semiconductor layer 12' for eventually obtaining a new LED element 1a'.

Electronic engineers skilled in development and manufacture of LED elements should know that, the copper-made substrate layer 19' is helpful to dissipate the heat produced under the operation of the LED element 1a'. However, the LED element 1a' obtained by using the lift-off method of U.S. Pat. No. 8,507,357 still exhibits following practical-application drawbacks:

(A) Owing to the excellent ductility and high plasticity of the copper-made substrate layer 19', the LED element 1a' may be damaged as a die saw process is applied to a wafer comprising a matrix of a plurality of the LED elements 1a'.
(B) On the other hand, since wet etching belongs to anisotropic etching, it is very difficult to well control for preventing an unwanted etching from occurring in the n-type semiconductor layer 12'.

From above descriptions, it is clear that how to replace sapphire substrate of LED element by other substrate with high thermal conductivity has now become the most important issue for LED foundries. In view of that, inventors of the present application have made great efforts to make inventive research thereon and eventually provided a flexible LED device and a flexible LED panel.

SUMMARY OF THE INVENTION

The primary objective of the present invention is to disclose a flexible LED device and a flexible LED panel. Differing an approach for substrate lift-off and bonding is conventionally adopted to exchange a sapphire substrate of an LED die for a copper substrate having excellent thermal conductivity, this novel flexible LED device is constituted by a thin-metal-made substrate, a substrate protection layer, a lattice matching layer, a light-emitting structure, a first electrode, and a second electrode. It is worth explaining that, thanks to that the thin-metal-made substrate with a thickness in a range from 25 μm to 150 μm exhibits outstanding mechanical characteristics including flexibility, thermal conductivity and thermal resistance, engineers can adopt thin film deposition technologies such as PECVD and MOCVD as well as utilize roll-to-roll manufacturing systems to mass produce this flexible LED device. Besides, heat produced during the illumination of the flexible LED device can be effectively dissipated by the thin-metal-made substrate.

For achieving the primary objective of the present invention, the inventor of the present invention provides an embodiment for the flexible LED device, comprising:
a flexible substrate made of a thin metal material;
a substrate protection layer, being covering the flexible substrate, or enclosing the flexible substrate;
a lattice matched layer, being formed on the substrate protection layer;
a light-emitting structure, comprising:
  a first semiconductor layer, being formed on the lattice matched layer;
  an active layer, being formed on the first semiconductor layer; and
  a second semiconductor layer, being formed on the active layer;
a first electrode, being electrically connected to the first semiconductor layer; and
a second electrode, being formed on the second semiconductor layer.

Moreover, in order to achieve the primary objective of the present invention, the inventor of the present invention also provides an embodiment for the flexible LED panel, comprising:

a flexible substrate made of a thin metal material;
a substrate protection layer, being covering the flexible substrate, or enclosing the flexible substrate;
a lattice matched layer, being formed on the substrate protection layer;
a plurality of light-emitting structures, wherein each of the light-emitting structures comprise:
    a first semiconductor layer, being formed on the lattice matched layer;
    an active layer, being formed on the first semiconductor layer; and
    a second semiconductor layer, being formed on the active layer;
a plurality of first electrodes, being electrically connected to the first semiconductor layers in the light-emitting structures, respectively;
a plurality of second electrodes, being electrically connected to the second semiconductor layers in the light-emitting structures, respectively; and
a transparent metal mesh substrate, comprising a transparent substrate, a plurality of first metal wires and a plurality of second metal wires, wherein the first metal wires are electrically connected to the first electrodes, respectively; moreover, the second metal wires being electrically connected to the second electrodes, respectively.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe a flexible LED device and a flexible LED panel according to the present invention, embodiments of the present invention will be described in detail with reference to the attached drawings hereinafter.

First Embodiment of Flexible LED Device

Figure 3:
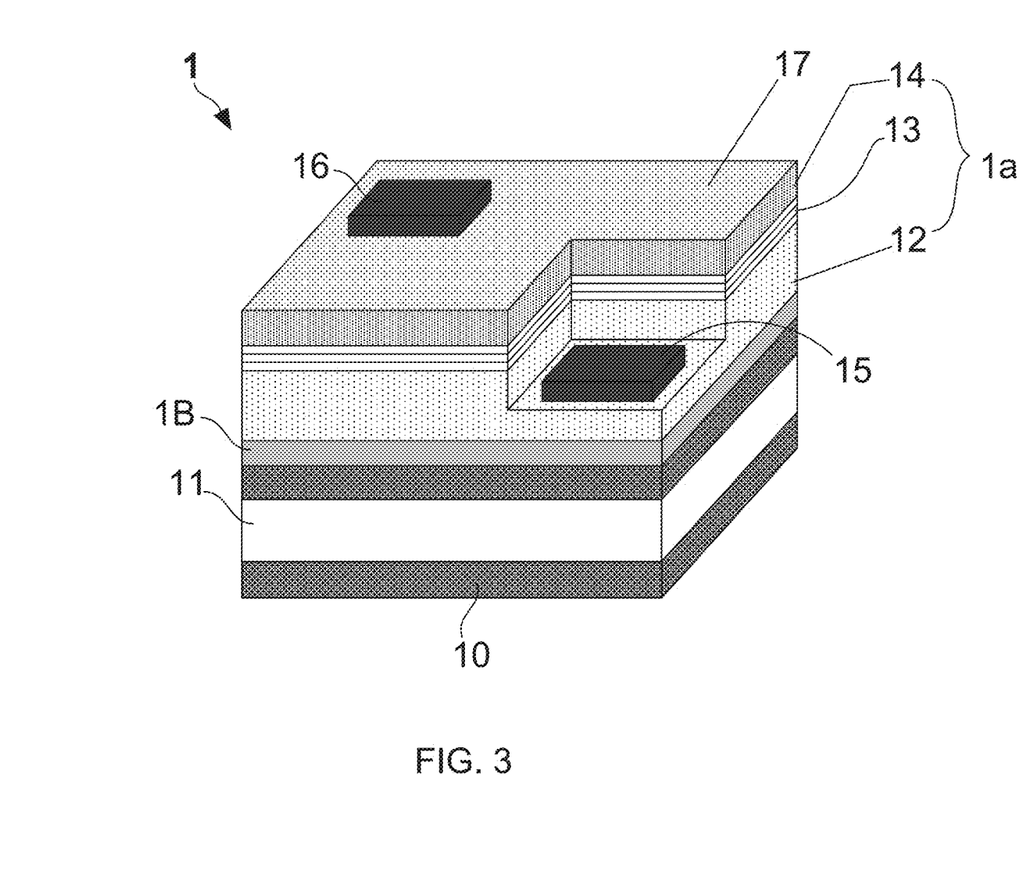
FIG. 3 shows a schematic stereo diagram of a first embodiment of a flexible LED device according to the present invention.

With reference to FIG. 3, there is provided a schematic stereo diagram of a first embodiment of a flexible LED device according to the present invention. The flexible LED device 1 can not only be a lighting element of a flexible illumination device, but also used as an elemental pixel of a flexible LED panel. As FIG. 3 shows, the flexible LED device 1 comprises: a flexible substrate 11, substrate protection layer 10, a lattice matched layer 1B, a light-emitting structure 1a, a first electrode 15, and a second electrode 16.

For the fabrication of the flexible LED device 1, the thickness of the flexible substrate 11 is controlled to be in a range from 25 μm to 150 μm, and the flexible substrate 11 can be made of a thin metal material selected from the group consisting of stainless steel, copper, gold, nickel, molybdenum, titanium, tungsten, and combination of aforesaid two or more materials. What is important to emphasize is that, since the light-emitting structure 1a is commonly made of multi-layered semiconductor epitaxial film, the outstanding thermal resistance of the thin metal material facilitates the flexible substrate 11 become the most suitable substrate of the flexible LED device 1. In addition, the flexible substrate 11 with the thickness of 25-150 μm not only shows excellent bendability, but also possesses outstanding thermal conductivity for being help to the heat dissipation of the flexible LED device 1.

As FIG. 3 shows, the substrate protection layer 10 is formed on the flexible substrate 11 and has a thickness in a range between 50 nm and 500 nm. It needs further explain that, when fabricating the flexible LED device 1, the flexible substrate 11 can also be enclosed by the substrate protection layer 10. By the use of the substrate protection layer 10, the flexible substrate 11 would be protected from being polluted by epitaxial materials during the formation of the multi-layered semiconductor epitaxial film. Moreover, the manufacturing material of the substrate protection layer 10 is selected from the group consisting of $SiO_2$, $TiO_2$, NiO, $Al_2O_3$, ZnO, nitride, halide, Si-based compound, and combination of aforesaid two or more materials.

It is worth noting that, the lattice matched layer 1B is formed on the substrate protection layer 10 and made of a crystalline material having a specific crystal orientation, such as AN, undoped-GaN, and ZnO. Herein $SiO_2$ and AlN are taken as exemplary materials for making the substrate protection layer 10 and the lattice matched 1B, respectively. The AlN has a hexagonal wurtzite structure with lattice constants (a=0.311 nm, c=0.498 nm). On the other hand, β-cristobalite $SiO_2$ has a lattice constant a=0.499 nm. What it must emphasize the fact that the substrate protection layer 10 mad of $SiO_2$ can not only protect the flexible substrate 11 from being polluting by epitaxial vapor-phase substances, but also facilitate the AN film (i.e., the lattice matched layer 1B) be formed on the substrate protection layer 10 along c-axis orientation. Moreover, other possible materials can be processed to be the substrate protection layer 10 and the lattice matched layer 1B are listed in following Table (1) and Table (2).

TABLE (1)

| Materials | Lattice constant (nm) |
|---|---|
| TiO2 | a = 0.462 |
| NiO | a = 0.418 |
| SnO2 | a = 0.474 |
| Al2O3 | a = 0.478 |

TABLE (2)

| Materials | Lattice constant (nm) | |
|---|---|---|
| GaN | a = 0.3186 | c = 0.5185 |
| ZnO | a = 0.328 | c = 0.52 |

In addition, a crystalline material with a lattice constant almost integral multiples of the lattice constant of GaN can also be processed to be the lattice matched layer 1B; for instance, Group II-VI compounds such as ZnS and ZnSe have the lattice constant a=0.623 nm and a=0.653 nm, respectively. On the other hand, light color of the light-emitting structure 1a is dependent on the manufacturing materials of the first semiconductor layer 12, the active layer 13 and the second semiconductor layer 14. GaP, GaAsP and AlGaAs are the traditional manufacturing materials of the active layer 13 for making the light-emitting structure 1a emit a visible light with a wavelength in a range between 580 nm and 740 nm. However, with the continuous advances of manufacture processing technology of metal-organic chemical vapor deposition (MOCVD), GaN, $Al=Ga_{1-x}N$ and $In_xGa_{1-x}N$ have become the major material for the fabrication of the active layer 13 nowadays. It is worth explaining that, active layer 13 made of GaN is able to emit blue light.

Electronic device engineers skilled in development and manufacture of LED dies should know that, light wavelength of the active layer 13 made of $In_xGa_{1-x}N$ can be regulated to be longer by increasing x (<1). On the other hand, increasing x can make light wavelength of the active layer 13 be regulated to be shorter. Herein, it needs to further describe that, the active layer 13 may form a single multiple quantum well (MQW) structure between the first semiconductor layer 12 and the second semiconductor layer 14, wherein the active layer 13 is made of GaN, $AlGa_{1-x}N$ or $In_xGa_{1-x}N$. Moreover, the first semiconductor layer 12 is made of n-type gallium nitride (n-GaN such as Si-doped GaN), and the second semiconductor layer 14 is made of p-type gallium nitride (p-GaN) like Mg-doped GaN. Furthermore, for enhancing electron-hole recombination rate in the active layer 13, the active layer 13 can be made to a multiple quantum well (MQW) structure between the first semiconductor layer 12 and the second semiconductor layer 14, wherein the MQW structure is selected from the group consisting of a multiple stacked structure of GaN and $In_xGa_{1-x}N$, a multiple stacked structure of GaN and $AlGa_{1-x}N$, and a multiple stacked structure of $Al_xGa_{1-x}N$ and $In_xGa_{1-x}N$.

Please refer to FIG. 3 again, which indicates that the first electrode 15 is electrically connected to the first semiconductor layer 12, and the second electrode 16 is formed on the second semiconductor layer 14. When manufacturing the flexible LED device 1, the manufacturing material of the first electrode 15 and the second electrode 16 can be selected from the group consisting of aluminum, silver, titanium, nickel, gold, copper, chromium, platinum, and combination of aforesaid two or more materials.

Second Embodiment of Flexible LED Device

Figure 4:
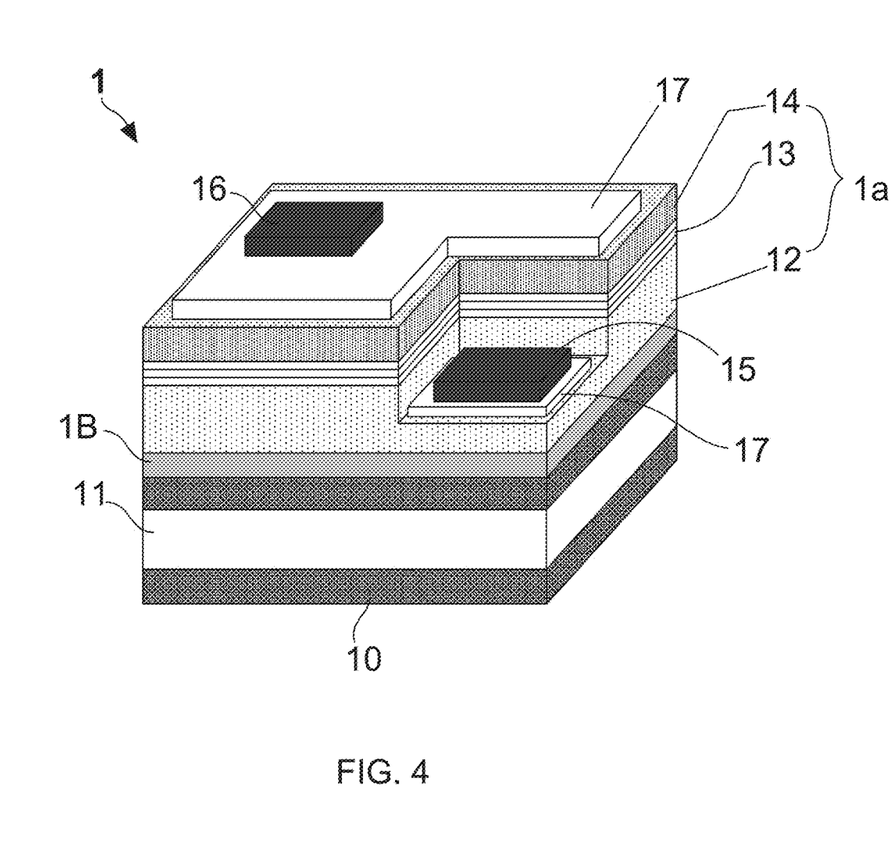
FIG. 4 shows a schematic stereo diagram of a second embodiment of the flexible LED device.

With reference to FIG. 4, there is provided a schematic stereo diagram of a second embodiment of the flexible LED device. After comparing FIG. 3 with FIG. 4, it is able to know the second embodiment of the flexible LED device 1 can be obtained by adding a transparent conductive layer 17 into the framework of the first embodiment. As FIG. 4 shows, the transparent conductive layer 17 is formed between the first electrode 15 and the first semiconductor layer 12 as well as the second electrode 16 and the second semiconductor layer 14. Moreover, the transparent conductive layer 17, used for enhancing out coupling efficiency of the flexible LED device 1 can be an indium tin oxide (ITO) film, a ZnO film, or a Ni—Au composite film.

Third Embodiment of Flexible LED Device

Figure 5:
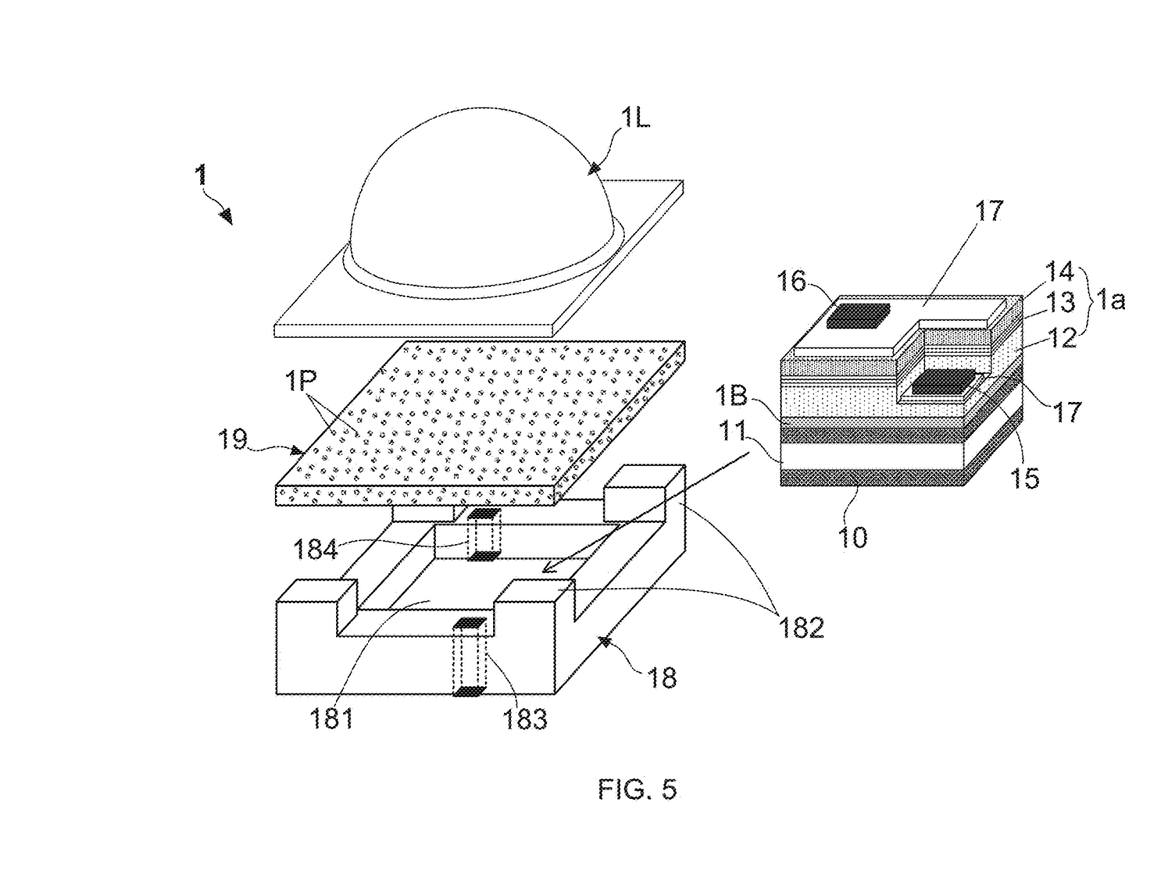
FIG. 5 shows a schematic exploded view of a third embodiment of the flexible LED device.

In third embodiment, the flexible LED device 1 is designed to be an LED component. FIG. 5 displays a schematic exploded view of the third embodiment of the flexible LED device. As FIG. 5 shows, the flexible LED device 1 comprises: a base 18, a flexible substrate 11, substrate protection layer 10, a lattice matched layer 1B, a light-emitting structure 1a, a first electrode 15, and a second electrode 16, a colloidal encapsulation cover 19, and a light diffusion lens 1L.

Inheriting to above descriptions, the base 18 is provided with an accommodating recess 181 for receiving a die of the flexible LED device 1. In addition, a first electrical terminal 183 is embedded in the base 18 and having a first wire bonding portion and a first welding portion, wherein the first wire bonding portion is exposed out of the top surface of the base 18 for being electrically connected to the first electrode 15, and the first welding portion is exposed out of the bottom surface of the base 18. On the other hand, a second electrical terminal 184 is embedded in the base 18 and having a second wire bonding portion and a second welding portion, wherein the second wire bonding portion is exposed out of the top surface of the base 18 for being electrically connected to the second electrode, and the second welding portion is exposed out of the bottom surface of the base 18.

Moreover, the colloidal encapsulation cover 19 is attached onto the base 18 and supported by a plurality of supporting pillars 182 disposed around the a recess opening of the accommodating recess 181, such that an air gap is formed between the colloidal encapsulation cover 19 and the recess opening of the accommodating recess 181. It is worth noting that, a plurality of light conversion particles 1P like fluorescent powder or quantum dots are spread in the colloidal encapsulation cover 19, and the light diffusion 1L lens is disposed on the colloidal encapsulation cover 19. Therefore, in the third embodiment, the flexible LED device 1 is further processed to a white LED component (chip). Correspondingly, the light-emitting structure 1a constituted by the first semiconductor layer 12, the active semiconductor layer 13 and the second semiconductor layer 14 is configured to emit blue light with wavelength in a range from 450 nm to 480 nm or ultra-violet light having wavelength in a range between 380 nm and 420 nm.

Moreover, exemplary materials of the fluorescent powder and the quantum dots for being used as the light conversion particles are integrated and listed in following Table (3) and Table (4).

TABLE (3)

| Types of fluorescent powder | Corresponding exemplary material |
|---|---|
| Aluminate phosphor | Eu doped Y—Al—O multi-composition phosphor |
| Silicate phosphor | $Ca_3Si_2O_7:Eu^{2+}$ |
| Phosphate phosphor | $KSr_{1-x}PO_4:Tb_x$ |
| | $K_2SiF_6:Mn^{4+}$ (KSF) |
| Sulfide phosphor | ZnS:X |
| | X = Au, Ag, Cu, Mn, Cd |
| Nitride phosphor | β-SiAlON:$Eu^{2+}$ |
| Other-type phosphor | $SrGa_2S_4:Eu^{2+}$ (SGS) |

TABLE (4)

| Types of quantum dot (QD) | Corresponding exemplary material |
|---|---|
| Group II-VI compounds | CdSe or CdS |
| Group III-V compounds | (Al, In, Ga)P, (Al, In, Ga)As, or (Al, In. Ga)N |
| Group III-V compounds having core-shell structure | CdSe/ZnS core-shell QD |
| Group III-V compounds having core-shell structure | InP/ZnS core-shell QD |

TABLE (4)-continued

| Types of quantum dot (QD) | Corresponding exemplary material |
|---|---|
| Group II-VI compounds having non-spherical alloy structure | ZnCdSeS |

Embodiment of Flexible LED Panel

Figure 6:
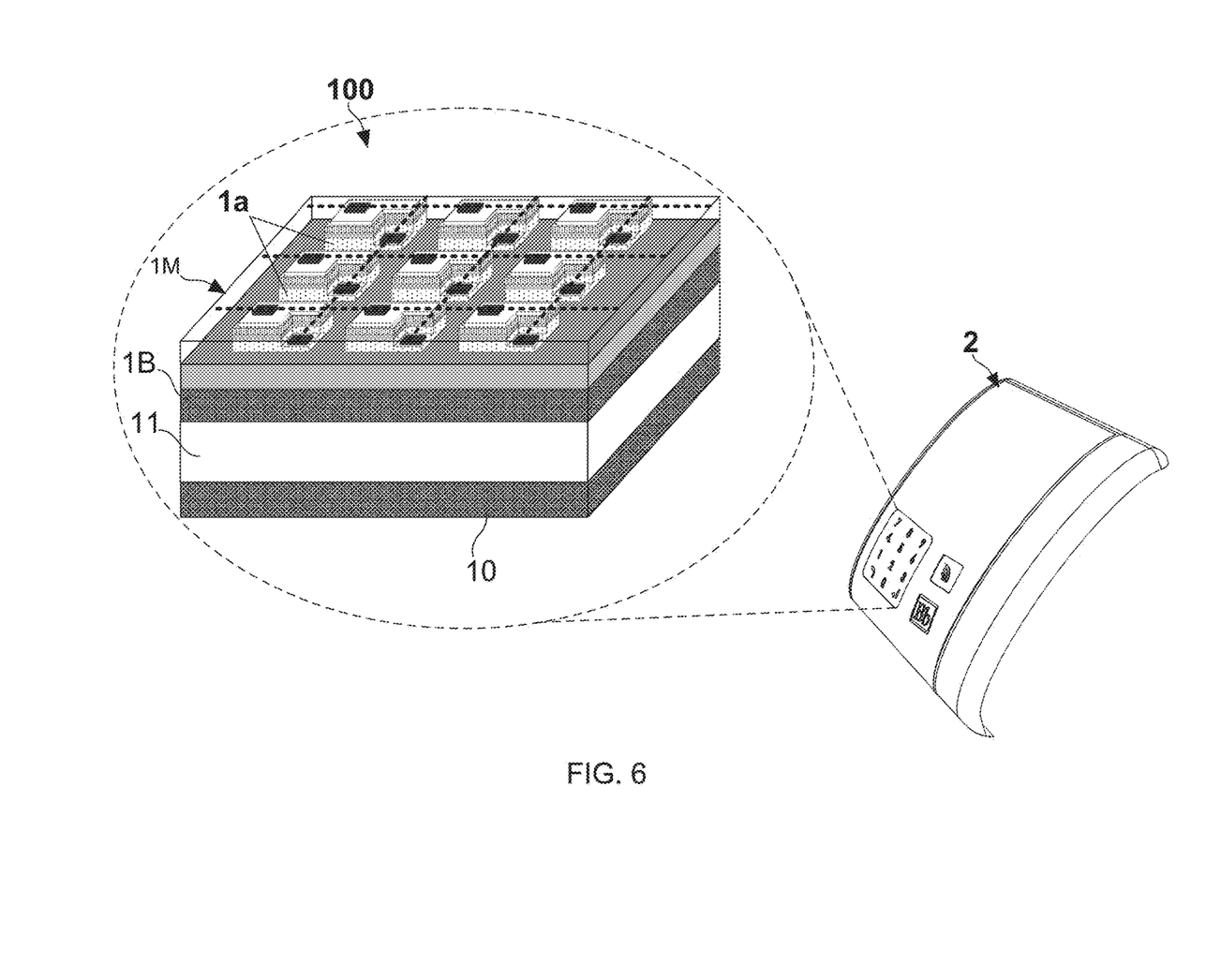
FIG. 6 shows a schematic stereo diagram of a flexible LED panel according to the present invention.

With reference to FIG. 6, there is provided a schematic stereo diagram of a flexible LED panel according to the present invention. Moreover, please simultaneously refer to FIG. 7, which illustrates a schematic exploded view of the flexible LED panel. As FIG. 6 and FIG. 7 show, the flexible LED panel 100 of the present invention can be applied in a flexible LED display 2, and comprises: a flexible substrate 11, substrate protection layer 10, a lattice matched layer 1B, a plurality of light-emitting structures 1a, a plurality of first electrodes 15, a plurality of second electrodes 16, and a transparent metal mesh substrate 1M.

Figure 7:
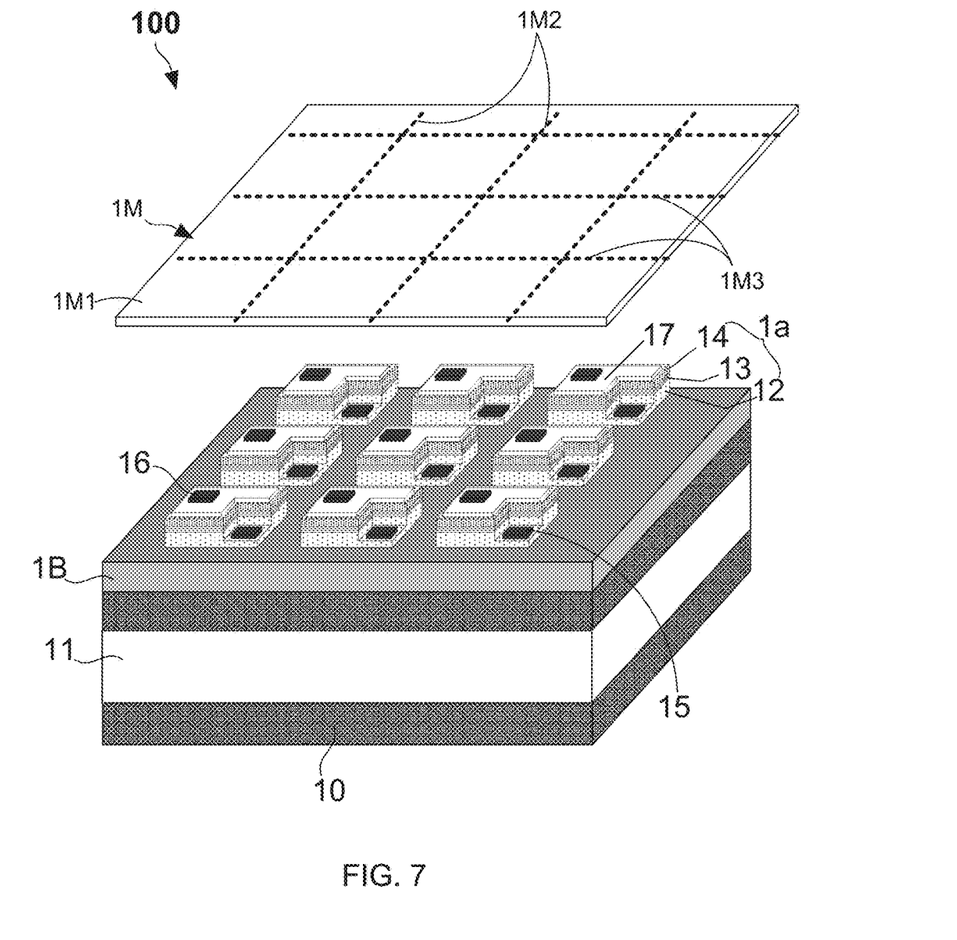
FIG. 7 shows a schematic exploded view of the flexible LED panel.

FIG. 7 indicates that each of the light-emitting structures 1a comprise a first semiconductor layer 12, an active layer 13, a second semiconductor layer 14, a first electrode 15, and a second electrode 16. On the other hand, the transparent metal mesh substrate 1M comprises a transparent substrate 1M1, a plurality of first metal wires 1M2 and a plurality of second metal wires 1M3, wherein the first metal wires 1M1 are electrically connected to the first electrodes 15, respectively. Moreover, the second metal wires 1M2 are electrically connected to the second electrodes 16, respectively.

Engineers skilled in development and manufacture of transparent conductive substrates should know that, the best model of the transparent metal mesh substrate 1M is ITO substrate or ZnO substrate.

Therefore, through above descriptions, the flexible LED device and the flexible LED panel have been introduced completely and clearly; in summary, the present invention includes the advantages of:

(1) Differing an approach for substrate lift-off and bonding is conventionally adopted to exchange a sapphire substrate of an LED die for a copper substrate having excellent thermal conductivity, this novel flexible LED device 1 is constituted by a thin-metal-made substrate, a substrate protection layer 10, a lattice matching layer 1B, a light-emitting structure 1a, a first electrode 15, and a second electrode 16. It is worth explaining that, thanks to that the thin-metal-made substrate with a thickness in a range from 25 μm to 150 μm exhibits outstanding mechanical characteristics including flexibility, thermal conductivity and thermal resistance, engineers can adopt thin film deposition technologies such as PECVD and MOCVD as well as utilize roll-to-roll manufacturing systems to mass produce this flexible LED device 1.

(2) Inheriting to above point (1), moreover, heat produced during the illumination of the flexible LED device 1 can be effectively dissipated by the thin-metal-made substrate.

The above description is made on embodiments of the present invention. However, the embodiments are not intended to limit scope of the present invention, and all equivalent implementations or alterations within the spirit of the present invention still fall within the scope of the present invention.

What is claimed is:
1. A flexible LED device, comprising:
a flexible substrate made of a thin metal material;
a substrate protection layer, being covering the flexible substrate, or enclosing the flexible substrate;
a lattice matched layer, being formed on the substrate protection layer;
a light-emitting structure, comprising:
a first semiconductor layer, being formed on the lattice matched layer;
an active layer, being formed on the first semiconductor layer; and
a second semiconductor layer, being formed on the active layer;
a first electrode, being electrically connected to the first semiconductor layer; and
a second electrode, being formed on the second semiconductor layer.

2. The flexible LED device of claim 1, wherein the thin metal material is selected from the group consisting of stainless steel, copper, gold, nickel, molybdenum, titanium, tungsten, and combination of aforesaid two or more materials; moreover, the manufacturing material of the lattice matched layer being selected from the group consisting of AlN, undoped-GaN, and ZnO.

3. The flexible LED device of claim 1, wherein the manufacturing material of the substrate protection layer is selected from the group consisting of $SiO_2$, $TiO_2$, NiO, $Al_2O_3$, ZnO, nitride, halide, Si-based compound, and combination of aforesaid two or more materials.

4. The flexible LED device of claim 1, wherein the first semiconductor layer is made of n-type gallium nitride (n-GaN), and the second semiconductor layer being made of p-type gallium nitride (p-GaN).

5. The flexible LED device of claim 1, wherein the active layer forms a single multiple quantum well (MQW) structure between the first semiconductor layer and the second semiconductor layer, and the active layer being made of GaN, $Al_xGa_{1-x}N$ or $In_xGa_{1-x}N$.

6. The flexible LED device of claim 1, wherein the active layer forms a multiple quantum well (MQW) structure between the first semiconductor layer and the second semiconductor layer, and the MQW structure be selected from the group consisting of a multiple stacked structure of GaN and $In_xGa_{1-x}N$, a multiple stacked structure of GaN and $AlGa_{1-x}N$, and a multiple stacked structure of $AlGa_{1-x}N$ and $In_xGa_{1-x}N$.

7. The flexible LED device of claim 1, wherein the manufacturing material of the first electrode and the second electrode is selected from the group consisting of aluminum, silver, titanium, nickel, gold, copper, chromium, platinum, and combination of aforesaid two or more materials.

8. The flexible LED device of claim 1, wherein the thickness of the flexible substrate is in a range from 25 μm to 150 μm, and the thickness of the substrate protection layer being in a range between 50 nm and 500 nm.

9. The flexible LED device of claim 1, further comprising:
a transparent conductive layer, being formed between the first electrode and the first semiconductor layer as well as the second electrode and the second semiconductor layer.

10. The flexible LED device of claim 1, further comprising:
a base, comprising:
an accommodating recess for receiving the flexible substrate, the substrate protection layer, the lattice matched layer, the light-emitting structure, the first electrode, and the second electrode;
a plurality of supporting pillars, being disposed around the a recess opening of the accommodating recess;
a first electrical terminal, being embedded in the base and having a first wire bonding portion and a first welding portion, wherein the first wire bonding portion is exposed out of the top surface of the base for being electrically connected to the first electrode, and the first welding portion being exposed out of the bottom surface of the base; and a second electrical terminal, being embedded in the base and having a second wire bonding portion and a second welding portion, wherein the second wire bonding portion is exposed out of the top surface of the base for being electrically connected to the second electrode, and the second welding portion being exposed out of the bottom surface of the base;

a colloidal encapsulation cover, being attached onto the base and supported by the supporting pillars, wherein a gap is formed between the colloidal encapsulation cover and the recess opening of the accommodating recess; and a plurality of light conversion particles, being spread in the colloidal encapsulation cover.

11. The flexible LED device of claim 10, further comprising a light diffusion lens disposed on the colloidal encapsulation cover.

12. A flexible LED panel, comprising:
a flexible substrate made of a thin metal material;
a substrate protection layer, being covering the flexible substrate, or enclosing the flexible substrate;
a lattice matched layer, being formed on the substrate protection layer;
a plurality of light-emitting structures, wherein each of the light-emitting structures comprise:
  a first semiconductor layer, being formed on the lattice matched layer;
  an active layer, being formed on the first semiconductor layer; and
  a second semiconductor layer, being formed on the active layer;
a plurality of first electrodes, being electrically connected to the first semiconductor layers in the light-emitting structures, respectively;
a plurality of second electrodes, being electrically connected to the second semiconductor layers in the light-emitting structures, respectively; and
a transparent metal mesh substrate, comprising a transparent substrate, a plurality of first metal wires and a plurality of second metal wires, wherein the first metal wires are electrically connected to the first electrodes, respectively; moreover, the second metal wires being electrically connected to the second electrodes, respectively.

13. The flexible LED panel of claim 12, wherein the thin metal material is selected from the group consisting of stainless steel, copper, gold, nickel, molybdenum, titanium, tungsten, and combination of aforesaid two or more materials.

14. The flexible LED panel of claim 12, wherein the manufacturing material of the substrate protection layer is selected from the group consisting of $SiO_2$, $TiO_2$, NiO, $Al_2O_3$, ZnO, nitride, halide, Si-based compound, and combination of aforesaid two or more materials.

15. The flexible LED panel of claim 12, wherein the manufacturing material of the lattice matched layer being selected from the group consisting of AN, undoped-GaN, and ZnO.

16. The flexible LED panel of claim 12, wherein the first semiconductor layer is made of n-type gallium nitride (n-GaN), and the second semiconductor layer being made of p-type gallium nitride (p-GaN).

17. The flexible LED panel of claim 12, wherein the active layer forms a single multiple quantum well (MQW) structure between the first semiconductor layer and the second semiconductor layer, and the active layer being made of GaN, $AlGa_{1-x}N$ or $In_xGa_{1-x}N$.

18. The flexible LED panel of claim 12, wherein the active layer forms a multiple quantum well (MQW) structure between the first semiconductor layer and the second semiconductor layer, and the MQW structure be selected from the group consisting of a multiple stacked structure of GaN and $In_xGa_{1-x}N$, a multiple stacked structure of GaN and $Al_xGa_{1-x}N$, and a multiple stacked structure of $Al_xGa_{1-x}N$ and $In_xGa_{1-x}N$.

19. The flexible LED panel of claim 12, wherein the manufacturing material of the first electrode and the second electrode is selected from the group consisting of aluminum, silver, titanium, nickel, gold, copper, chromium, platinum, and combination of aforesaid two or more materials.

20. The flexible LED panel of claim 12, further comprising:
a transparent conductive layer, being formed between the first electrode and the first semiconductor layer as well as the second electrode and the second semiconductor layer.

* * * * *